United States Patent [19]

Kawashima

[11] 3,863,171

[45] Jan. 28, 1975

[54] COMPARISON AMPLIFIER

[75] Inventor: Yoshichi Kawashima, Gifu, Japan

[73] Assignee: Nippondenso Co., Ltd., Kariya-shi, Aichi-ken, Japan

[22] Filed: Mar. 28, 1973

[21] Appl. No.: 345,497

[30] Foreign Application Priority Data

Mar. 30, 1972 Japan .............................. 47-032020

[52] U.S. Cl. ................................................ 330/30 D
[51] Int. Cl. ............................................. H03f 3/10
[58] Field of Search .................................. 330/30 D

[56] References Cited

UNITED STATES PATENTS

| | | | |
|---|---|---|---|
| 3,541,464 | 11/1970 | Slemmer | 330/30 D |
| 3,617,855 | 11/1971 | Hisatsu | 330/30 D |

*Primary Examiner*—William L. Sikes
*Assistant Examiner*—Richard A. Rosenberger
*Attorney, Agent, or Firm*—Cushman, Darby & Cushman

[57] ABSTRACT

In a comparison amplifier which comprises a differential amplifier stage for effecting differential amplification having two separate terminals to be supplied with two types of input signals and two input transistors connected to the respective terminals, and a constant current source stage for driving the differential amplifier stage so as to amplify a difference voltage between the afore-mentioned two types of input signals; the differential amplifier stage includes at least one constant current source transistor for passing a constant current therethrough and two diodes connected between the last mentioned transistor and respective input transistors and also connected to respective two transistors of the constant current source stage, whereby the allowable range for the difference voltage between input signals is increased and the minimum level of the input voltage signals can be lowered.

5 Claims, 1 Drawing Figure

COMPARISON AMPLIFIER

BACKGROUND OF THE INVENTION

1. Field of the Invention

The present invention relates to a comparison amplifier, and more particularly to the improvement of a transistor comparison amplifier.

2. Description of the Prior Art

The conventional comparison amplifier utilizes two emitter-coupled input transistors for differential amplification which are driven by a simple constant current source transistor of constant current source stage to differentially amplify input voltages applied to an inverting input terminal and a non-inverting input terminal, thereby ensuring the comparison amplification of the input signals. With this construction, a bias voltage between the input terminal and the source terminal can be decreased to about 0.8 volts equal to the summation of the saturation voltage of the constant current source transistor and a base-emitter voltage drop of the input transistor. However, the difference voltage between the two input terminals cannot be allowed to have a maximum value more than about 7 volts equal to a base-emitter breakdown voltage of the input transistor with the result that the range of differential amplification is degraded.

In another type of the prior art comparison amplifier, the common base of two transistors is connected to a single constant current source transistor of the constant current source stage, and one input transistor associated with one transistor and the other input transistor associated with the other transistor are differentially operated to effect comparison amplification of the two types of input signals. With this amplifier, it is possible to apply between the input terminals a difference voltage up to several tens of volts, equal to the base-emitter breakdown voltage of each of a pair of input transistors and also equal to that of the transistor. However, the bias voltage applied between either the inverting input terminal and the source terminal or non-inverting input terminal and the source terminal cannot be minimized to less than 1.5 volts which is the summation of the saturation voltage of the transistor of constant current source stage and a base-emitter voltage drop of the afore-mentioned paired transistors of the differential amplifiers stage, so that the range of input voltage is reduced.

SUMMARY OF THE INVENTION

It is a main object of the invention to provide a comparison amplifier having a wide input voltage range and a wide differential amplification range in order to eliminate the above drawbacks. According to the invention, in a comparison amplifier for amplifying a difference voltage between two types of input signals which comprises a differential amplifier stage for effecting differential amplification having two input transistors to be supplied with the two types of input signals and a constant current source for driving the differential amplifier stage, the improvement of the same comprises the constant current source stage including two constant current source transistors connected to the individual emitters of the two input transistors, and the differential amplifier stage including two diodes one of the electrodes of each of which is connected to different constant current source transistors for passing a constant current and the other is separately connected to each of the two constant current source transistors so as to enhance the allowable range for the difference voltage between input signals applied to the input transistors. The comparison amplifier with this construction of the invention permits not only the enhancement of allowable range for the difference voltage between the afore-mentioned two types of input signals so as to widen the differential amplification range, but also the reduction of the minimum voltage of the afore-mentioned input signals so as to increase the voltage operation range of the input signals.

Other objects, features and advantages of the invention will be best understood from the following detailed description when taken in conjunction with the accompanying drawing wherein one embodiment of a comparison amplifier of the invention is illustrated.

DESCRIPTION OF THE PREFERRED EMBODIMENT

Figure 1:
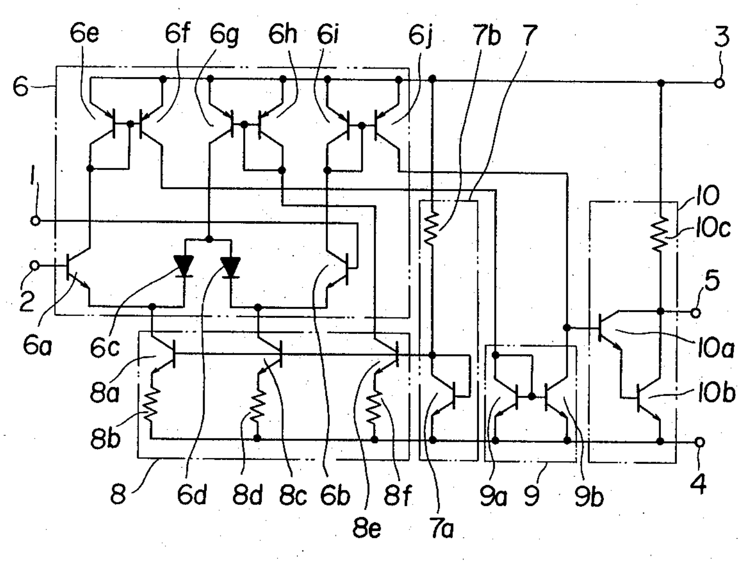

With reference to the single FIGURE of the drawing which is an electrical schematic diagram of a comparison amplifier according to the invention, the comparison amplifier comprises an inverting terminal 1, a non-inverting terminal 2, power supply terminals 3 and 4, an output terminal 5, a differential amplifier 6 consisting of pnp-type input transistors 6*a* and 6*b* for effecting differential amplification, diodes 6*c* and 6*d*, npn-type load transistors 6*e*, 6*f*, 6*i* and 6*j* for differential amplifier and transistors 6*g* and 6*h*, a constant current circuit 7 consisting of an pnp-type constant current transistor 7*a* and a collector resistor 7*b*, a constant current source 8 consisting of constant current source transistors 8*a*, 8*c* and 8*e* and emitter resistors 8*b*, 8*d* and 8*f*, output circuit 9 consisting of pnp-type output transistors 9*a* and 9*b* for a differential amplifier current, and an output amplifier 10 consisting of pnp-type output transistors 10*a* and 10*b* and a collector resistor 10*c*.

The operation of a comparison amplifier with this construction according to the invention, will be described below. An input voltage representative of an input signal applied to an inverting input terminal 1 is subtracted from an input voltage representative of the other input signal applied to a non-inverting input terminal 2 and a difference voltage in turn is amplified. Then, a constant current is allowed to flow through the constant current source transistors 8*a*, 8*c* and 8*e* of constant current source 8 coupled to the constant current circuit 7. The constant current which flows through the constant current source transistor 8*e* drives other transistors 6*g* and 6*h* to allow the constant current to flow through the transistor 6*g*. Therefore the following equations (1), (2) and (3) are held:

$$I_{6a} + I_{6c} = I_8 \tag{1}$$

$$I_{6b} + I_{6d} = I_8 \tag{2}$$

$$I_{6c} + I_{6d} = I_{6g} \tag{3}$$

where, $I_8$ represents a constant current flowing through respective constant current source transistors 8*a* and 8*c*, $I_{6g}$ a current flowing through another constant current source transistor 6g, and $I_{6a}$, $I_{6b}$, $I_{6c}$ and $I_{6d}$ currents flowing through input transistors 6*a* and 6*b* and diodes 6*c* and 6*d*, respectively.

The following equation (4) can be derived from the equations (1), (2) and (3):

$$I_{6a} + I_{6b} = 2I_8 - I_{6g} \quad (4)$$

It will be seen from the equation (4) that the sum of the currents flowing through input transistors 6*a* and 6*b* is constant. The differential amplifier 6 effects the differential operation in cooperation with the constant current circuit 7 and the constant current source 8.

In other words, when the non-inverting input terminal 2 receives an input voltage signal slightly high compared to the other input voltage signal applied to the inverting input terminal 1, the current $I_{6a}$ flowing through the input transistor 6*a* increases so that the same amount of reduction in the current $I_{6b}$ flowing through the input transistor 6*b* as the increment of the current $I_{6a}$ is caused to maintain the total current ($I_{6a} + I_{6b}$) constant. While, a diode bias circuit comprised of the load transistors 6*e*, 6*f*, 6*i* and 6*j* for the differential amplifier and the output transistors 9*a* and 9*b* of output circuit 9 substantially equalizes the amount of emitter current which flows through respective pairs of base-coupled transistors 6*e* and 6*f*, 6*i* and 6*j*, and 9*a* and 9*b*, so that the emitter current of the respective output transistors 9*a* and 9*b* for a differential amplifier current, identical with the collector current of the afore-mentioned current source transistor 6*f* for the differential amplifier, becomes equal to the current $I_{6a}$ flowing through the input transistor 6*a*. For a similar reason, the collector current of the load transistor 6*j* equals the current $I_{6b}$ flowing through the input transistor 6*b*. It can be understood that the base current of the output transistor 10*a* of output amplifier 10 equals a difference current ($I_{6b} - I_{6a}$) between the currents flowing through the input transistors 6*a* and 6*b*, and that the output transistors 10*a* and 10*b* will pass output currents in response to a difference voltage between input voltage signals applied to the inverting terminal 1 and the non-inverting terminal 2. As seen from the above description, the difference voltage between input signals received by the inverting input terminal 1 and the non-inverting input terminal 2 is amplified and derived from the output terminal 5 as an output voltage. The bias voltage between the inverting input terminal 1 and the power supply terminal 4 or the non-inverting input terminal 2 and the power supply terminal 4 can be minimized to about 0.8 volts which is equal to the sum of the saturation voltage of constant current source transistors 8*a* and 8*c* and a base-emitter voltage drop of input transistors 6*a* and 6*b*. Reversely, the difference voltage which is allowable to be applied to the two input terminals 1 and 2 can be increased up to several tens of volts since the base-emitter breakdown voltage of input transistors 6*a* and 6*b* and the breakdown voltage of diodes 6*b* and 6*c* are added.

What is claimed is:

1. A comparison amplifier comprising a differential amplifier having two input transistors to be supplied with two types of input signals for effecting differential amplification and a constant current source for driving said differential amplifier so as to amplify a difference voltage between said two types of input signals, said constant current source including two constant current source transistors connected to said two input transistors, respectively, and said differential amplifier including two diodes being connected together at one end of each forming a common end connected to a transistor for passing a constant current, the other ends of said two diodes being connected to said two constant current source transistors, respectively, to increase the allowable range for the difference voltage between input signals applied to said input transistors, and said differential amplifier further including two load transistors connected directly to collectors of said input transistors, respectively, for supplying collector current to said input transistors.

2. A comparison amplifier for amplifying a difference voltage between individual input signals comprising, two input terminals for receiving said individual input signals; a differential amplifier stage including a pair of input transistors connected to said input terminals, at least one transistor for making the sum of the collector currents of said input transistors constant, two load transistors connected directly to the collectors of said input transistors respectively for supplying collector currents to said input transistors, and two diodes connected between said transistors for making the sum of the collector currents constant and said pair of input transistors respectively in such a direction as to increase the allowable range for a difference voltage between input signals applied to said individual input transistors; and a constant current source stage for driving said differential amplifier stage including two constant current source transistors connected to said pair of input transistors respectively and to said diodes respectively.

3. A comparison amplifier according to claim 2, wherein said constant current source stage includes a separate constant current source transistor for driving said transistor for making the sum of the collector current constant of said differential amplifier stage.

4. Amplifier means for amplifying a difference voltage between input signals comprising a differential amplifier stage for effecting differential amplification having two active elements for receiving two individual input signals and a constant current source stage for driving said differential amplifier stage: said differential amplifier stage including a pair of input transistors, each having a base, an emitter and a collector, adapted to receive said individual two input signals at their bases; individual load transistor means connected to the collectors of the input transistors and acting to derive an output signal; a pair of diode means and a transistor supplying a constant current to said pair of diode means and driven by a power supply in common with said load transistor means; said pair of diode means increasing an allowable range for the difference voltage between said input signals, having negative electrodes connected to the respective emitters of said pair of input transistors and positive electrodes connected to said transistor for supplying a constant current; said constant current source stage including a circuit network for constituting a constant current source consisting of transistors and resistors connected to the junctures of said pair of input transistors and said pair of diodes, respectively.

5. The amplifier means for amplifying a difference voltage between input signals according to claim 4, wherein said constant current source stage consists of resistors and transistors in series connection and is supplied with power from a constant current circuit connected to a power supply.

* * * * *